United States Patent [19]
Zhou

[11] Patent Number: 5,449,930
[45] Date of Patent: Sep. 12, 1995

[54] HIGH POWER, COMPOUND SEMICONDUCTOR DEVICE AND FABRICATION PROCESS

[76] Inventor: Guo-Gang Zhou, 360 Sheridan Ave., Apt. 204, Palo Alto, Calif. 94306-2015

[21] Appl. No.: 561,102

[22] Filed: Aug. 1, 1990

[51] Int. Cl.$^6$ .................. H01L 23/367; H01L 29/06; H01L 29/812
[52] U.S. Cl. ..................................... 257/197; 257/276
[58] Field of Search ..................... 357/22 R, 22 H, 55, 357/81, 80; 257/276, 192

[56] References Cited

U.S. PATENT DOCUMENTS

| | | | |
|---|---|---|---|
| 4,092,660 | 5/1978 | Blocker | 357/22 |
| 4,189,682 | 2/1980 | Sechi | 330/277 |
| 4,189,688 | 2/1980 | Sechi et al. | 331/117 FE |
| 4,416,053 | 11/1983 | Figueroa et al. | 29/572 |
| 4,578,127 | 3/1986 | Gossand et al. | 357/456 |
| 4,794,093 | 12/1988 | Tong et al. | 437/203 |
| 4,807,022 | 2/1989 | Kazior et al. | 357/81 |
| 4,842,699 | 6/1989 | Hua et al. | 204/15 |

OTHER PUBLICATIONS

K. Rauschenbach and C. A. Lee, "The opposed gate-source transistor", *Microwaves & RF*, Mar. 1987, pp. 155–165.

G. B. Gao et al., "Thermal design studies of high-power heterojunction bipolar transistors", *IEEE Trans. on Electron Devices*, vol. 36, May 1989, pp. 854–863.

Plessey PLC announcement, *Electronics*, Feb. 4, 1988, p. 51.

M. Salimian et al., "Single wafer reactive ion etching of GaAs with controllable selectivity to AlGaAs", *Varian Etch Application Note EAN-2*, Aug. 1987.

H. F. Cooke, "Thermal Resistance of Multigate FETs", presented at joint meeting of the PGMIT and EDS, Palo Alto Calif., Dec. 1987.

M. Salimian et al., "Through-the-wafer via etch process on GaAs wafers in a single wafer RIE etcher", *Varian Etch Application Note EAN-1*, May 1987.

P. M. Asbeck et al., Tech. Dig. IEDM, 1984, p. 864.

*Primary Examiner*—William D. Larkins
*Attorney, Agent, or Firm*—Schneck & McHugh

[57] ABSTRACT

This invention is related to a III–V type of compound semiconductor device, having improved heat dissipation and high power operating characteristics, which is comprised of a semi-insulating III–V compound semiconductor wafer substrate having a frontside and a backside, a compound semiconductor etch stop layer, having an etch rate much slower than that of the wafer substrate, epitaxially grown on the frontside of said wafer substrate, an active compound semiconductor device consisted of at least two layers of compound semiconductor material epitaxially grown on the said etch stop layer, wells on the backside of said wafer substrate located underneath heat generating regions of said active device, wherein the wells are formed by etching action until the depth of wells reach said etch stop layer, and a heat conducting material disposed said wells.

14 Claims, 5 Drawing Sheets

HIGH POWER, COMPOUND SEMICONDUCTOR DEVICE AND FABRICATION PROCESS

TECHNICAL FIELD

The present invention relates to active solid state devices and integrated circuits of the high power, compound semiconductor type, such as group III-V compound semiconductor devices, as well as to manufacturing processes for these semiconductor devices, and in particular to such devices and processes made with a heat sink and with substrate thinning for improved cooling.

BACKGROUND ART

The performance, reliability and package density of many types of compound semiconductor devices, including integrated circuits (ICs), are constrained by the devices' ability to dissipate heat. For example, most members of the group II-IV and III-V type of compound semiconductor have poor thermal conductivity. Therefore, in order to improve one of these devices' high power operating characteristics, one must increase the device's heat dissipation capability by reducing the heat conduction pathlength between the device's heat generating regions and an external heat sink. At the same time, reducing the heat conduction path length must not significantly degrade the device's performance or reducing the mechanical strength of the wafer substrate during the manufacturing process. The best known group III-V compound semiconductor is gallium arsenide (GaAs), which is used to make many kinds of GaAs devices, including some with high power GaAs field effect transistors (FETs) and the high power GaAs/AlGaAs heterojunction bipolar transistors (HBTs). The main sources of heat generation in these devices are: (a) the drain-source channels of the GaAs FETs, (b) emitter finger regions of the GaAs/AlGaAs HBTs, and (c) resistors on the GaAs ICs.

In U.S. Pat. No. 4,189,682 and U.S. Pat. No. 4,189,688, Sechi describes providing heat dissipation by mounting a heat sink to the top of the device. This technology is generally known as the flip mounting technology, since the device is first turned upside down before mounting on metal heat sink posts. This technology requires extra components, extra manufacturing equipment and skilled operators in a time consuming aligning/mounting task. The heat dissipation is still not very efficient, since the heat sink is typically placed at some distance away from the heat sources and through poor thermal conductivity paths. Therefore, this technology is not very much in common use.

Another class of prior art is to place one of the electrodes (either the gate or the source) on the backside of the wafer connecting to a heat sink. The heat dissipation capability of this configuration is generally very high. For example, in U.S. Pat. No. 4,092,660, Blocker describes placing the gate on the backside of the wafer and connecting it to a heat sink for efficient heat dissipation. However, the large gate to source capacitance resulting from this configuration would seriously degrade its high frequency performance (for example, above 4 GHz). Another problem with this configuration, which severely limits its application to ICs, is the requirement that the heat sink on the back surface of the substrate be physically connected to one of the electrodes of the device formed on the front surface of the substrate.

Another configuration has recently been described by workers from two leading manufacturers of GaAs devices: U.S. Pat. No. 4,807,022, Kazior et al. from Raytheon Company and U.S. Pat. No. 4,842,699, Hua et al. from Avantek, Inc. In this configuration, via holes are etched from the back of the wafer substrate all the way through the wafer substrate to reach the metal pads of the electrodes of the device on the front side of the wafer substrate, and then high thermal conductivity materials are deposited in these via holes to improve the heat dissipation of the device. This configuration is not very efficient in heat dissipation because the via holes have limited cross-sectional area and are generally located some distance away from the heat generating regions of the device. An improved configuration of this class, known as the opposed gate-source transistor (OGST) was recently reported by a group from Cornell University, where the source is placed on the backside of the wafer connecting to a heat sink. (See article entitled: "The opposed gate-source transistor", which is published in March 1987 issue of Microwaves & RF, pages 155 through 165, and authored by K. Rauschenbach and C. A. Lee). This structure uses an AlGaAs etch stop layer for controlled etching of wells on the backside of the wafer. However, this particular structure is not compatible with any undoped buffer layer above the etch stop layer and thus it is not applicable to any GaAs planar FETs. This structure also suffers from the same limitation as the Blocker type of device described above, since its heat sink on the back surface of the substrate is physically connected, through a hole in the etch stop layer, to one of the electrodes of the device formed on the front surface of the substrate. In addition, this structure requires that the drain and the source be placed at a small distance apart (a few tenths of a $\mu$m), which results in low breakdown voltage between the drain and the source. Furthermore, the large drain to source capacitance of this structure, since the drain is separated from the source by merely a few tenths of a $\mu$m, should result in poor high frequency performance.

A recent paper proposes yet another method to improve the heat dissipation in high power GaAs HBTs by simply fabricating the GaAs device on silicon (Si) wafer substrate, which has higher thermal conductivity and 3 times higher power handling capability than GaAs substrate. This paper is entitled: "Thermal design studies of high-power heterojunction bipolar transistors", which is published in May 1989 issue of IEEE Transactions on Electron Devices, Vol. 36, pages 854–863, and authored by G.-B. Gao et al. However, the technology of growing GaAs on Si is still in the early developmental stage with many unsolved manufacturing problems.

The most widely practiced prior art in high power GaAs FETs and GaAs ICs nowadays is simply to manufacture devices on GaAs wafer substrate and then reduce the heat conduction pathlength by thinning the thickness of the whole wafer substrate to about 100 $\mu$m. The active device of this class is first fabricated on the frontside of a starting GaAs wafer substrate, typically 250–500 $\mu$m thick, then the backside of the wafer is thinned by mechanical or chemical means until the thickness of the wafer is about 100 $\mu$m, and finally a high thermal conductivity metal layer, typically either gold (Au) alone or a combination of palladium (Pd) and gold, is electro-chemically plated or thermally evaporated onto the backside of the wafer before the backside of the wafer substrate is soldered or epoxied to a heat sink carrier. Obviously, the thinner the GaAs wafer is, the better the heat dissipation will be for the device. However, the wafer substrate thickness of 100 μm is considered to be a practical compromise, because at this thickness the wafer substrate still possess both sufficient mechanical strength to withstand subsequent process handling and sufficient dielectric separation for transmission lines formed between GaAs IC's strip conductors on the frontside of the wafer substrate and the ground plane on the backside of the wafer substrate.

A further improvement of the above described prior art is to further reduce the heat conduction pathlength by selectively thinning the wafer substrate underneath the heat generating regions of the device to form etch wells (or "tub structures") and then back fill these etch wells with materials of high thermal conductivity, such as Au and Pd. This method, however, suffers from the high risk of etch-through if the distance between the bottom of the etch well and the active device is reduced to a value close to the total thickness variation of the final wafer, which is the sum of the thickness non-uniformity of the starting wafer and additional thickness variations created during the wafer thinning process. Therefore, this total thickness variation of the final wafer, which usually can be as much as 10–20 μm, places a practical limitation on the reduction of the heat conduction pathlength through selectively thinning of the wafer in the form of etch wells (or "tub structures"). This practical limitation imposed by the thickness variation of the final wafer is illustrated by the following three examples.

Example one: Plessey PLC of United Kingdom recently announced (see Electronics, Feb. 4, 1988, p. 51) the development of a high power GaAs FET process, by which wells are etched in the backside of a 200 μm thick GaAs wafer beneath the high power GaAs transistors. Then Au is filled in the wells as the high thermal conductivity material. This process reduces the heat conduction pathlength to about 50 μm by placing the Au to about 50 μm from the FET power transistor. Example two: a similar technique to form uniformly etched wells (or "tub structures") in the backside of a 100 μm thick GaAs IC beneath the heat generating regions is described in detail by Tong et al from Raytheon Company, a major manufacturer of GaAs devices and ICs, in a recent patent (U.S. Pat. No. 4,794,093; issued on Dec. 27, 1988). In this patent, Tong et al reported a method to reduce the heat conduction pathlength to about 20 to 50 μm (or 20 to 50% of the thickness of the 100 μm thick wafer substrate). Example three: the largest GaAs power FETs in commercial use today, Fujitsu Model FLM 4450-8B, which has 36 dBm output power per chip and 8 dB gain at 4 to 5 GHz. The total gate width is 12 millimeters with gate to gate spacing of 20 μm and with 84 gate fingers. The semi-insulation GaAs wafer substrate is thinned to about 40 μm and then a 35 μm thick Au is plated on the backside.

The above mentioned heat conduction pathlengths, which are the distances between the high thermal conductivity material and the heat generating regions, are respectively 50 μm for the Plessey FETs, 20 to 50 μm for the devices described in the Raytheon patent, and 40 μm for the Fujitsu FETs. These are the smallest heat conduction pathlengths currently known for GaAs devices and ICs.

As is shown later that this invention is able to provide a practical structure consisting of a combination of an epitaxial undoped GaAs buffer layer and an epitaxial AlGaAs etch stop layer to overcome etch-through and other problems and to achieve a much reduced heat conduction pathlength of about 0.2 to 10 μm. This improved heat dissipation structure with a much reduced heat conduction pathlength would result in a significant improvement of device life and performance.

It should be noted that an undoped AlGaAs buffer layer as an optical window has been used in Burris type of optical detection devices. A representative Burris device is described in U.S. Pat. No. 4,416,053, by Figueroa et al. which shows the use of an undoped $Al_x Ga_{1-x}As$ buffer layer as an optical window. The x value required for these devices is usually higher than 0.35, which would make the buffer layer to contain much too many traps and DX centers to be useful as a buffer layer for stable high power high frequency GaAs devices and ICs.

It is an object of the present invention to provide a high power compound semiconductor device or IC, essentially those of the group III–V compound semiconductor type, with a practical and improved heat dissipation structure by selectively placing materials of high thermal conductivity in etch wells located underneath and within 0.2 to 10 μm from the heat generating regions of the active device, while minimizing the drain-to-source parasitic capacitance, and at the same time improving the mechanical strength (or to reduce the fragility) of the device.

DISCLOSURE OF THE INVENTION

The above objects have been met by a compound semiconductor device which is provided with a compound semiconductor etch stop layer on a front surface of a compound semiconductor substrate and with wells formed in a back surface of the substrate, proximate to heat generating regions of at least one active compound semiconductor device formed in layers above the etch stop layer, and extending through the back substrate surface to the etch stop layer. The wells are filled with thermally conductive material. One of the layers immediately above the etch stop layer may be an undoped compound semiconductor buffer layer. This structure reduces the heat conduction pathlength between the heat sink material in the wells and the heat generating regions of the active semiconductor device or devices, thereby improving heat dissipation. The heat conduction pathlength in this case is equal to the combined thickness of the etch stop and buffer layers. The structure is thus applicable to high power devices, especially of the group III–V semiconductor compound type. The presence of the etch stop layer combined with the use of wells ensures mechanical integrity of the structure by overcoming the problem of etchthrough and the like. The objects are also met by a method of fabricating such a structure.

In another embodiment, the wells are characterized by at least two different depths such that only deepest portions of the wells extend all the way through the back of the substrate to the etch stop layer. In this structure the depths of the well portions under the drain electrodes of an active semiconductor device or devices can be made less than the depths of the well portions under the source electrodes and source-to-drain channels of the active devices. The heat conduction pathlengths under the drain electrodes are accordingly larger than the corresponding pathlengths under the sources and channels, but the drain-to-source parasitic capacitance is reduced. This structure may be made by using a two step etch of the wells in one fabrication process of the present invention.

BEST MODE FOR CARRYING OUT THE INVENTION

Figure 1:
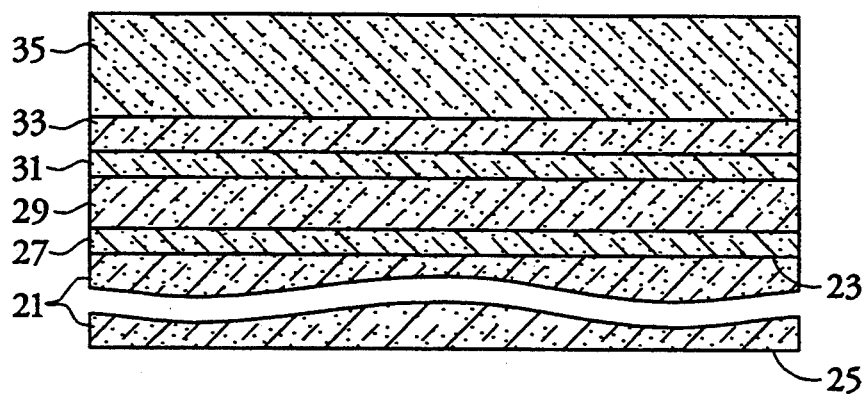
FIG. 1 is a sectional view taken generally along the lines 1—1 in FIG. 6, showing a device after an initial stage of processing to form the epitaxial layers.

With reference to FIG. 1, the first step of making a high power planar GaAs FET device of the present invention is to epitaxially grow an etch stop layer on a standard starting wafer and then epitaxially grow an undoped (unintentionally doped or is not totally free of impurities but is not intentionally doped) GaAs buffer layer on top of the etch stop layer, both on the frontside of the wafer. In FIG. 1, a starting semi-insulation GaAs wafer substrate 21 has a typical thickness of 250 to 500 $\mu$m, with a frontside 23 and a backside 25. An etch stop layer 27, typically AlGaAs, is epitaxially grown to about 0.1 to 10.0 $\mu$m in thickness, typically either by the molecular beam epitaxy (MBE) method or the metal organic chemical vapor deposition (MOCVD) method. Since a typical growth rate is about 1 $\mu$m/hr, the more typical thickness range is 0.2 to 1.0 $\mu$m in order to keep the time consumed in the growth process to a reasonable range. The x value of the $Al_xGa_{1-x}As$ layer can be chosen to be smaller than 0.3 in order to reduce the concentration of traps and DX centers. However, with the addition of an epitaxially grown undoped GaAs buffer layer 29, approximately 0.2 to 10 $\mu$m thick, on the etch stop layer typically also by either of the MBE or MOCVD methods, the effect of the traps and centers in the etch stop layer 27 on the active device is minimized. An optional superlattice layer 31, typically 0.03 to 0.05 $\mu$m thick, can sometimes be grown on the buffer layer 29 to eliminate possible buffer leakage current due to relatively thick buffer. The super-lattice layer 31 is also able to reduce defects and stress caused by the etch stop layer 27. If such super-lattice layer 31 is grown, then an additional thin undoped layer 33, 0.1 to 1.0 $\mu$m thick, is usually grown on the top of the super-lattice layer 31 as an additional buffer. The total thickness of the buffer and super-lattice layers 31 and 33 is in the range of 0.2 to 10 $\mu$m. However, since the growth rate of these layers is also typically about one $\mu$m/hr, the more typical total thickness range is 0.2 to 5.0 $\mu$m in order to keep the time consumed in the growth process to a reasonable range. A total buffer thickness of 2 to 3 $\mu$m may in most of the applications be optimum. Then an n-type GaAs active layer or layers 35, typically 0.1 to 0.3 $\mu$m thick with doping concentration of typically $3 \times 10^{17}$ $cm^{-3}$, is epitaxially grown on the buffer layer 29 or 33, depending whether a super-lattice layer 31 is used.

A simple n-type FET device is then fabricated in the above described active layer 35 with well known FET fabrication methods as described by two typical books listed in the following: (1) "Microwave Field-Effect Transistors—Theory, Design and Applications", authored by R. S. Pengelly, published by Wiley & Sons (New York, reprinted 1984); and (2) "GaAs FET Principle and Technology", edited by J. V. DiLoenzo and D. D. Khandelwal, published by Artech House (1982).

At this moment, after the FET device is fabricated, the wafer is usually thinned so that the wafer may have better heat dissipation capability and may also be able to go through latter processes such as scribe and dice with greater ease, however at the expense of reduced mechanical strength. The thinning process starts by mounting the wafer upside down onto a quartz slide, several millimeters in thickness, with the wafer's frontside bonded to the quartz slide by a bonding agent such as wax. The backside 25 of the wafer substrate 21 is then thinned in the typical way as shown in Chapter 16 on "Back Side Processing" of the book entitled: "Gallium Arsenide Processing Techniques", which is authored by Ralph E. Williams and published by Artech House, Inc. (1984). This is typically done either by mechanical or electro-chemical methods until the total thickness of the wafer is about 80 to 160 μm.

Figure 2:
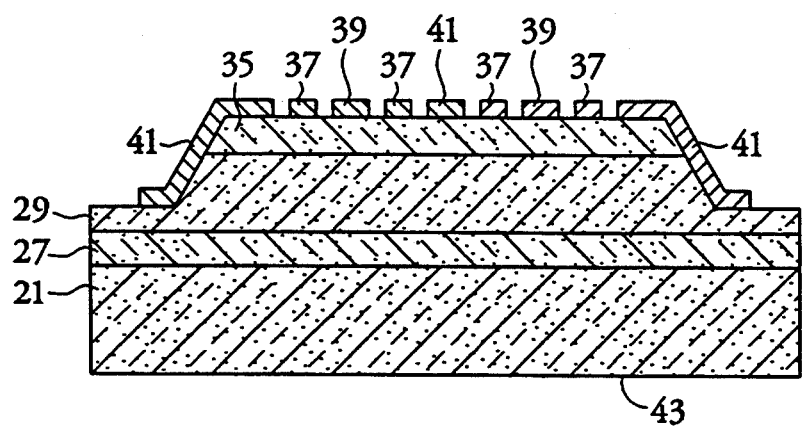
FIG. 2 is a sectional view of the device shown in FIG. 1 after a further stage of processing to form the mesa, the active device, and backside thinning of the wafer.

FIG. 2 shows a fabricated simple n-type FET device with gate electrodes 37, drain electrodes 39, and source electrodes 41 on a thinned wafer with its new substrate backside 43. The quartz slide, which is bonded to the top of the device until the demounting just before the wafer is scribed, is purposely not shown in FIG. 2 and other later figures in order to provide more clarity to the various stages of manufacturing of the device in these figures. Also not shown in FIG. 2 and subsequent figures are the optional epitaxial layers 31 and 33 discussed in above paragraphs, as well as shown in FIG. 1.

Figure 3:
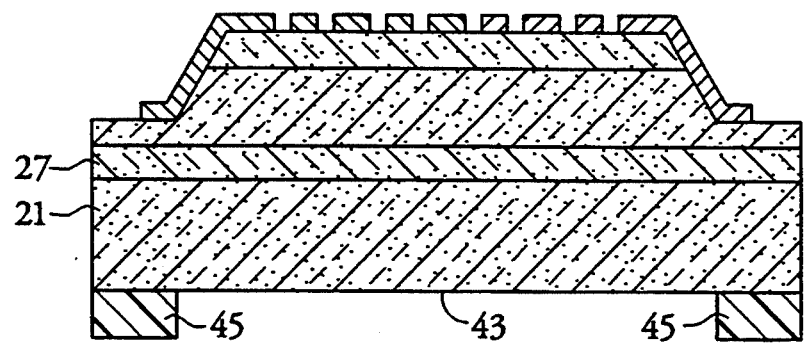
FIG. 3 is a sectional view of the same device shown in FIG. 2 after a further stage of processing to form a photoresist mask for the well etch.

After the thinning process, a thin metal mask or a photoresist mask 45 is applied to the backside 43 of the wafer with the standard photolithographic process and usually with the aid of an infrared aligner so that a backside pattern is aligned to the pattern of the frontside. In this way, wells or windows 47 directly underneath the heat sources, such as the active device region (e.g., the drain-to-source channel region) of a FET or resistors on a GaAs IC, can be created by etching the unmasked areas. FIG. 3 shows the device after the photoresist mask 45 has been added to the backside 43.

Figure 4:
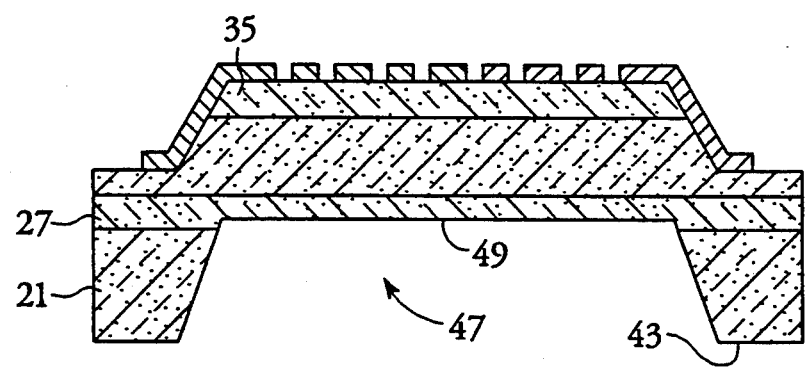
FIG. 4 is a sectional view of the same device shown in FIG. 3 after a further stage of etching process to form a well for the heat conductor.

The wells 47 are then etched on the backside 43 of the wafer until the bottom 49 of the wells reaches the etch stop layer 27, as shown in FIG. 4. RIE (reactive ion etching) method is usually the preferred etching method. Other etching method, such as wet etching can also be used. However, the RIE method is preferred, because it has a higher etch selectivity in this case. The etch selectivity is defined as the ratio of the etch rate of the wafer substrate to the etch rate of the etch stop layer. The RIE etch rate in GaAs is more than 500 times higher than the etch rate in $Al_xGa_{1-x}As$, where the range for x is 0.2 to 0.9. The AlGaAs etch stop layer is selected to insure the thickness uniformity of the etch process, since the thickness non-uniformity in GaAs is reduced by more than 500 times when translated into thickness non-uniformity in AlGaAs. That is, a thickness non-uniformity of 20 μm in GaAs is translated into only about 0.04 μm in the AlGaAs etch stop layer 27. Therefore, even though the initial wafer is not uniform, the well etching can be stopped at a very close and uniform distance from the active layers 35 containing active GaAs devices. Using a safety factor of 5 against accidental etch through, the thickness of the AlGaAs etch stop layer 7 can be chosen to be about one one-hundredth of the total final wafer thickness variation, or about 0.2 μm. It should be noted here that the general rule for the thickness, t, of an etch stop layer, is:

$$t = (F \times DT)/R,$$

where DT is the combined thickness variation of the wafer after thinning process, R is the etch selectivity or the ratio of the etch rate of the wafer substrate 21 to the etch rate of the etch stop layer 27, and F is the safety factor. For example, if we let DT be 20 μm, R be 500, and F be 5, then t is 0.2 μm. It should be pointed out here that, according to the above formula, if the etch selectivity is small, then the thickness of the etch stop layer 27 will have to be large. As mentioned in the previous paragraphs, since the growth of an epitaxial layer is very slow, one must try to keep the etch stop layer 27 within reasonable range of 0.2 to 1.0 μm by selecting an etch stop layer material and etch method so that the etch selectivity is reasonably high.

For a more detailed description on RIE and AlGaAs, one is referred to read the Etch Application Note on the Varian RIE equipment, which is entitled: "Single wafer reactive ion etching of GaAs with controllable selectivity to AlGaAs", by M. Saliomian, C. B. Cooper and F. Wong, dated August 1987. The typical etch gases for RIE are $SF_6$:$SiCl_4$ and $CCl_2F_2$ at a typical pressure of 10 to 100 millitorrs. These RIE parameters could be adjusted to achieve different slope of the side walls of the etched well 47. FIG. 4 shows the cross-sectional view of the wafer with the etched well 47 after the RIE etch. The typical etch time is 20 to 60 minutes. A steeper slope for the side walls of the etched well 47 is not necessary nor desirable because the steeper sidewalls may cause coverage problem at the sputter or evaporation stage of the base metals for the plating process later on. Also, this slope may affect the thermal conductivity of the heat conductor. Typically, the slope is about 70 degrees relative to the base surface 43. After the completion of RIE, a wet etch may optionally be applied to the wafer to remove a thin layer of AlGaAs from the bottom 49 of the etched well, usually a few hundredth of a micron, which is roughened and damaged during RIE process.

Figure 5:
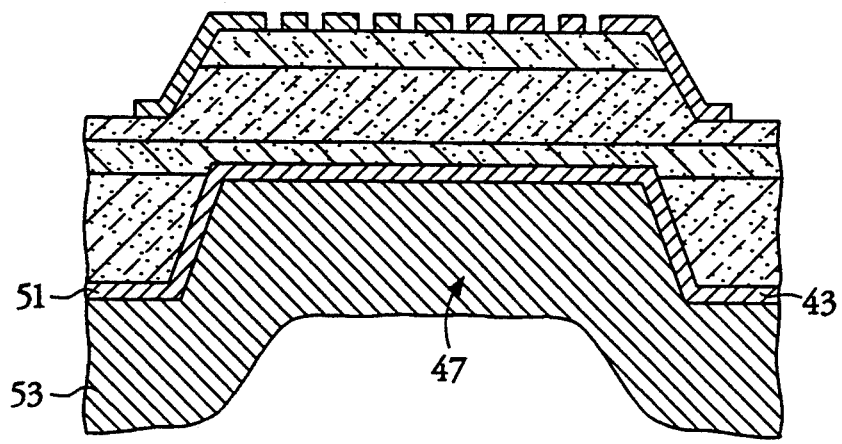
FIG. 5 is a sectional view of the completed device representing the first embodiment of this invention, which is the same device shown in FIG. 4 after a further stage of processing to plate the gold heat conductor to the device.

With reference to FIG. 5, before the Au heat conductor is plated to the etched well, a base metal layer 51 as a plating conductor is first thermally evaporated or sputtered into the etched well 47 to give thorough coverage of the walls of the etched well. The typical base metal layer 51 is made of one or a combination of Ti, Au and other base metal layers with a typical total thickness range of 0.05 to 0.2 μm. The purpose of a thin Ti or Pd layer before the Au layer is to improve adhesion and to prevent the Au from interdiffusing with GaAs and AlGaAs. A standard procedure at this point is to remask the backside 43 of the wafer to cover the scribe alleys to prevent these alleys from being plated. The wafer is then plated by using a standard electro-chemical Au plating process. The typical thickness of the plated Au 53 can range from 10 to 100 μm. Finally the photoresist is stripped from the wafer. The wafer is then demounted from the quartz slide and scribed (along the unplated scribe alleys), and then the wafer is separated into individual chips. FIG. 5 shows the cross-sectional view of the finished device with a base metal layer 51 and plated Au heat conductor 53.

Figure 6:
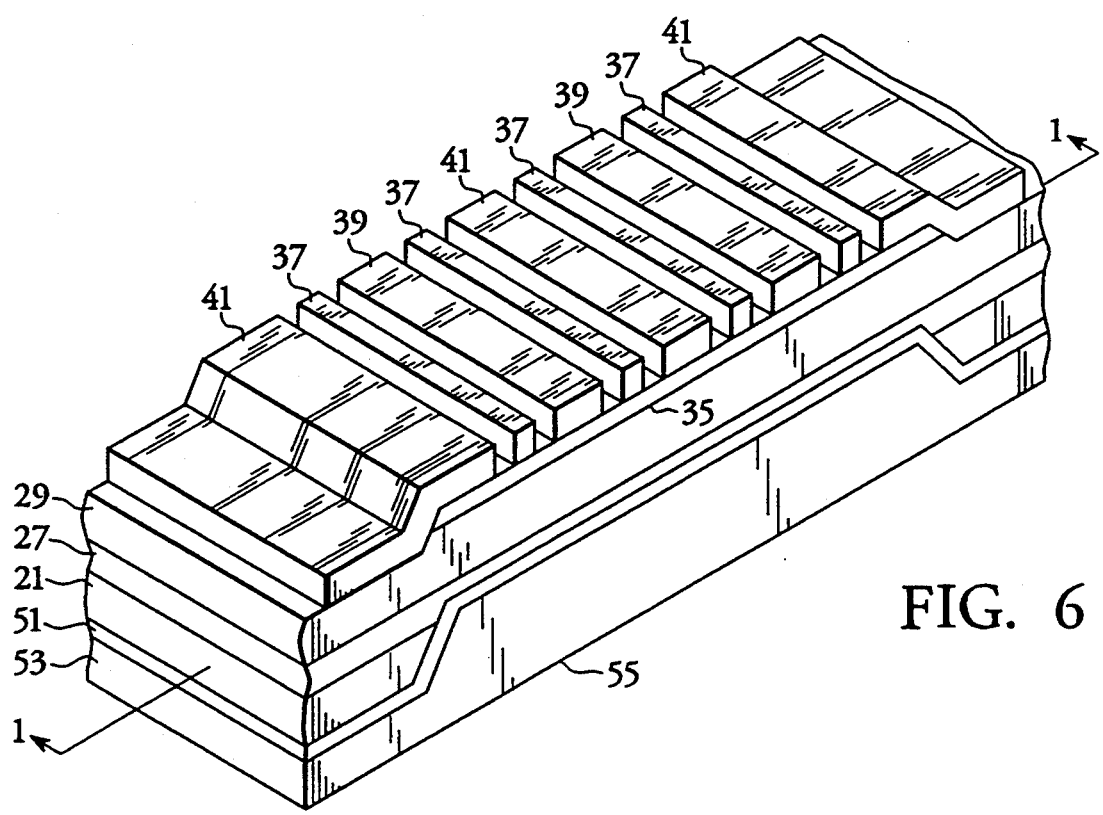
FIG. 6 is a perspective view illustrating the first embodiment of this invention, which is the same device shown in FIG. 5 after a further stage of processing to smoothen the bottom surface of the heat conductor metal in order to facilitate its subsequent mounting to a carrier.

The bottom surface of the heat conductor metal layer 53 in FIG. 5, may be mechanical or electro-chemical lapped or polished into a smooth ground plane 55, as shown in FIG. 6, before the chip containing the device or the IC is soldered or epoxied to a heat sink carrier. The smooth ground plane 55 would provide good thermal contact with a subsequent heat sink carrier.

There may be some residual stress induced by the manufacturing process and additional stress created during the device operation at elevated temperatures in the well regions of these chips. This stress may affect the performance and characteristics of the completed device. However, the effect of the stress can be minimized by experimentally adjusting the thickness of the buffer layer 29 and by adjusting the thickness of the plated Au layer 53. Baking the final wafer at 200° to 250° C. prior to the scribing could also reduce the residual stress in the well region 47.

Since the Au heat conductor 53 is typically operated at the source potential, the close placement of the Au heat conductor 53 to the active regions 35 of the device of this invention is expected to increase the parasitic capacitance between the electrodes 37, 39 and 41. This increased parasitic capacitance between electrodes may therefore reduce the device's high frequency performance. The estimated parasitic capacitance between the gate and drain electrodes 37 and 39 for a interdigital GaAs FET having the new heat dissipation structure with 2.0 μm heat conduction pathlength, the distance between the heat generating regions (the drain-to-source channel and the plated heat conductor at the bottom of the etched well) is less than 10% of the intrinsic total gate to source capacitance. Therefore, this parasitic capacitance will not have significant effect on the device's high frequency performance. The drain 39 to source 41 parasitic capacitance will be larger and is comparable to the channel Gunn domain parasitic capacitance. However, this parasitic capacitance can either be reduced by increasing the buffer layer thickness, thus the heat conduction pathlength, to about 3-10 μm, or be tuned away by an extrinsic circuitry in narrow band applications. Thicker buffer layer 29 has the disadvantage of very lengthy growth time. Another way to significantly reduce the parasitic capacitance between drain and source electrodes 39 and 41 is by using a novel two step well etching structure described in the following paragraphs as the second preferred embodiment of this invention.

Figure 7:
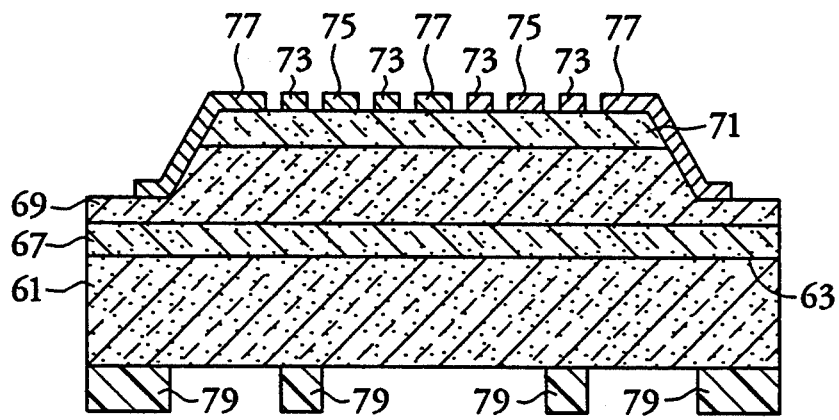
FIG. 7 is a sectional view taken generally along the lines 7—7 in FIG. 12, showing a device after an initial stage of processing to form the epitaxial layers, the mesa, the active device, and the photoresist mask for a first well etch.

With reference to FIG. 7, in order to further minimize the drain to source parasitic capacitance and at the same time to improve the mechanical strength (or to reduce the fragility) of the device, a two step well etching structure is described below. In this structure, the heat conduction pathlength to the drain electrodes 75 is made larger, by about 10 to 40 μm, than that to the drain-source channels under gate electrodes 73 and the source electrodes 77. The initial manufacturing steps, up to the completion of the wafer thinning as shown in FIGS. 1 through 2, for this device is the same of the one step well etching structure described above. The result is a device having a compound semiconductor substrate 61, an etch stop layer 67 on a front surface 63 of substrate 61, an undoped compound semiconductor buffer layer 69 and one or more active layers 71 with gate, drain and source electrodes 73, 75 and 77 defining an active semiconductor device or devices. The compositions and layer thicknesses are as described above for the first embodiment.

The first well etch step of this device, either by RIE or wet etch method, is performed on the backside 65 of the wafer with a photoresist mask 79 which only exposes the areas underneath the drain-source channels and the source electrodes 77 but not the areas underneath the drain electrodes 75 as shown in FIG. 7. The alignment of the photoresist mask 79, which is more critical for this structure than for the one step etch structure, is done with the help of an infrared aligner so that the backside pattern is aligned to the pattern of the frontside to an accuracy of about 2 μm.

Figure 8:
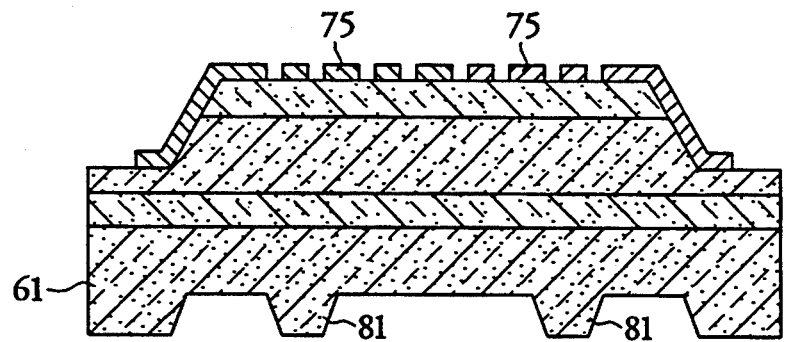
FIG. 8 is a sectional view of the same device shown in FIG. 7 after a further stage of etching to form the first well configuration.
Figure 9:
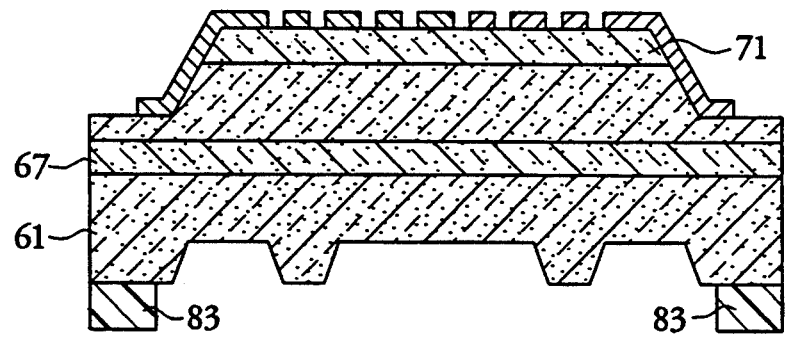
FIG. 9 is a sectional view of the same device shown in FIG. 8 after a further stage of processing to form a photoresist mask for a second well etch.

The depth of the first etch could be typically from 20 to 40 μm. FIG. 8 shows the wafer structure after the completion of the first etch and the removal of the first etch mask 79. The areas underneath the drain electrodes 75 are left as un-etched islands 81 on the backside 65 of the wafer. The wafer is then remasked with photoresist 83 for a second well etch as shown in FIG. 9, where the second mask 83 is shown to expose the entire area underneath the active region 71.

Figure 10:
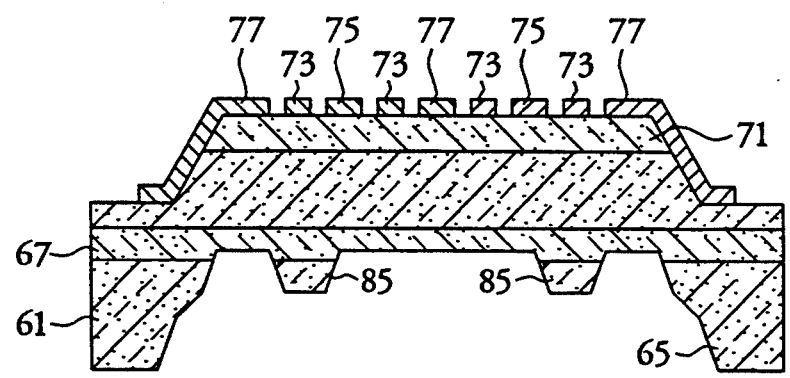
FIG. 10 is a sectional view of the same device shown in FIG. 9 after the second well etch for the heat conductor.

The second well etch step of this device, by the high selectivity RIE method, is stopped after reaching the AlGaAs etch stop layer 67. FIG. 10 shows the wafer after the completion of the second etch and the removal of the second etch mask 83. In FIG. 10, the gate electrodes are shown as 73, drain electrodes as 75, and source electrodes as 77. The areas underneath the drain-source channels and the source electrodes 77 are shown to be etched all the way to the AlGaAs stop layer 67, whereas areas underneath the drain electrodes 75 are left as GaAs islands 85 with 10 to 40 μm in thickness. Therefore, in this two step well configuration, the drain to source parasitic capacitance is minimized and at the same time the mechanical strength of the device is improved (or fragility is reduced).

Figure 11:
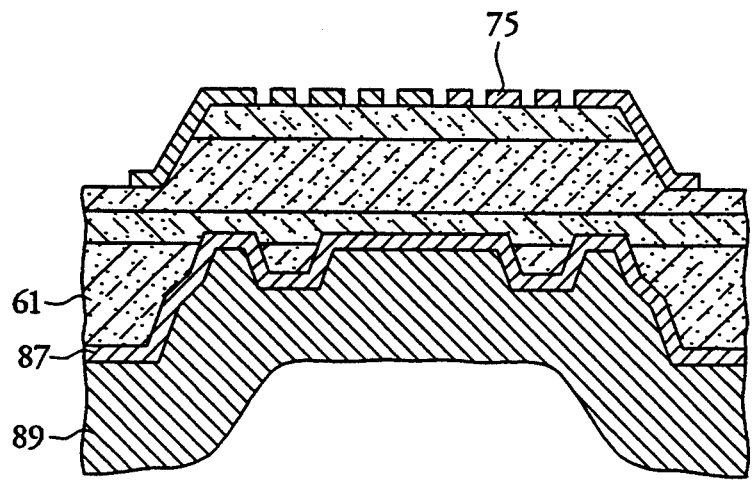
FIG. 11 is a sectional view of the same device shown in FIG. 10 after a further stage of processing to plate the gold heat conductor to the device.

Then the wafer is subjected to the same procedure as described above for the one step well etching structure to add base metal layer 87, and a plated Au layer 89 as heat conductor, as shown in FIG. 11.

Figure 12:
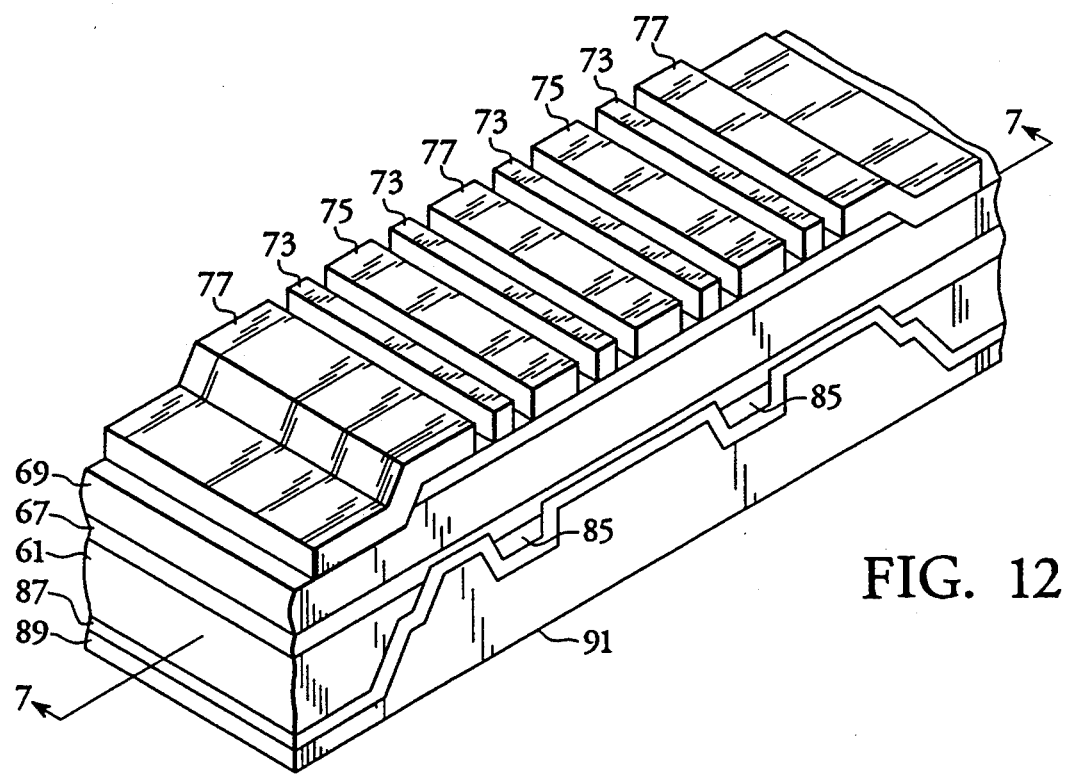
FIG. 12 is a perspective view illustrating a second embodiment of this invention, which is the same device shown in FIG. 11 after a further stage of processing to smoothen the bottom surface of the heat conductor metal in order to facilitate its subsequent mounting to a carrier.

The bottom surface of the heat conductor metal layer 89 in FIG. 11, may be mechanical or electro-chemical lapped or polished into a smooth ground plane 91, as shown in FIG. 12, before the chip containing the device or the IC is soldered or epoxied to a heat sink carrier. The smooth ground plane 91 would provide good thermal contact with a subsequent heat sink carrier.

It should be noted here that the above two step well configuration is an example to configurations involving more than two steps in the etching of the wells by using more than two etching processes in order to further optimize the heat dissipation, parasitic capacitance and mechanical strength of the device.

The following example estimates the reduction of device channel temperature and the improvement of the device performance as well as the reliability (or life) due to the above described new and improved heat dissipation structure having shortened heat conduction pathlength. One of the largest GaAs power FETs in commercial use is the Fujitsu Model FLM 4450-8B, which has 36 dBm output power per chip and 8 dB gain at 4 to 5 GHz. The total gate width is 12 mm with gate to gate spacing of 20 μm and with 84 gate fingers. The semi-insulation GaAs substrate is thinned to about 40 μm and then a 35 μm thick Au is plated on the backside as heat conductor. This substrate thickness is the thinnest one currently known for all commercially available GaAs power FETs. The thermal resistance in this case is about 5° C. per watt, which is also the lowest currently known amongst all commercially available GaAs power FETs. Assuming that the typical power added efficiency of 25% and the packaged thermal resistance of 4° C./W for this device, the channel temperature can be calculated to be 115° C. at an ambient temperature of 25° C. With the present invention, the improved heat dissipation structure having a 3 μm thick GaAs buffer layer 69 (heat conduction pathlength), implemented in this Fujitsu device, and using the formulas given by an article written by Harry F. Cooke (which is entitled: "Thermal Resistance of Multigate FETs" and presented in part at a joint meeting of the PGMTT and EDS at Palo Alto in December 1978, and available from Harry F. Cooke at the Solid State Microwave Division of Varian Associates), the channel temperature can be calculated to be about 79° C. The effect of this reduction in channel temperature is that the device gain can be increased by (about 2 times) 0.3 dB and the device reliability in terms of MTTF (mean time toward failure) can be improved by about 72 times at an activation energy of 1.4 eV.

This improved heat dissipation structure is also compatible with the widely used process known as the source via hole process (see the article entitled: "Through-the-wafer via etch process on GaAs wafers in a single wafer RIE etcher", published as Varian Etch Application Note EAN-1 May 1987, authored by M. Salimian et al), by which a through (via) hole is etched from the backside of the wafer to the source pads and then the hole is plated with Au. Since the via holes are formed in the source bonding pad regions (non-active regions) of the device, these via holes can be formed, rather independently from the heat conductor well forming process, by remasking and etching, prior to the final Au plating step, the backside of the wafer directly underneath the source pads. However, a non-selective wet etching step may be required to remove the AlGaAs etch stop layer in the via holes. The order for masking and etching the wells and via holes can be reversed. That is, the via holes can be formed prior to the masking and etching the heat conductor wells.

A third embodiment of this invention is in the form of a high power GaAs/AlGaAs compound semiconductor transistor, commonly known as the heterojunction bipolar transistor (HBT).

Figure 13:
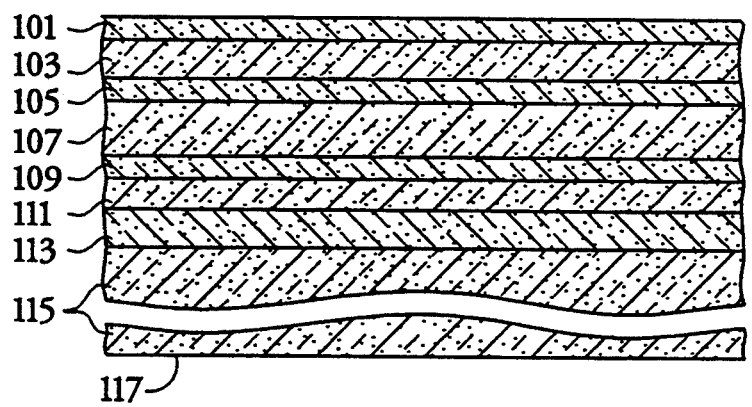
FIG. 13 is a sectional view of a third embodiment of this invention, in the form of a GaAs/AlGaAs HBT (heterojunction bipolar transistor), showing the device after an initial stage of processing to form the epitaxial layers.

After the initial stage of processing to form epitaxial layers, which is similar to that described earlier in this specification for the FET devices, a typical GaAs/AlGaAs HBT of the third embodiment of this invention is shown in FIG. 13. It contains seven layers, which are respectively in the reverse order of epitaxial growth, a 0.05-0.1 $\mu$m thick n+ type GaAs emitter contact layer 101; a 0.1-0.2 $\mu$m thick n type AlGaAs emitter layer 103, a 0.03-0.1 $\mu$m thick p+ type GaAs base layer 105, a 0.2-0.4 $\mu$m thick n− type GaAs collector layer 107 and a 0.05-0.1 $\mu$m thick n+ type GaAs collector contact layer 109, a 0.2 to 10 $\mu$m thick undoped (unintentionally doped or is not totally free of impurities but is not intentionally doped) GaAs buffer layer 111, and a 0.1-10 $\mu$m thick AlGaAs etch stop layer 113, all grown by MBE or MOCVD methods on the semi-insulating GaAs substrate 115. The semi-insulating GaAs wafer substrate 115 is usually 250-300 $\mu$m thick, and the backside of this wafer is labeled 117.

Figure 14:
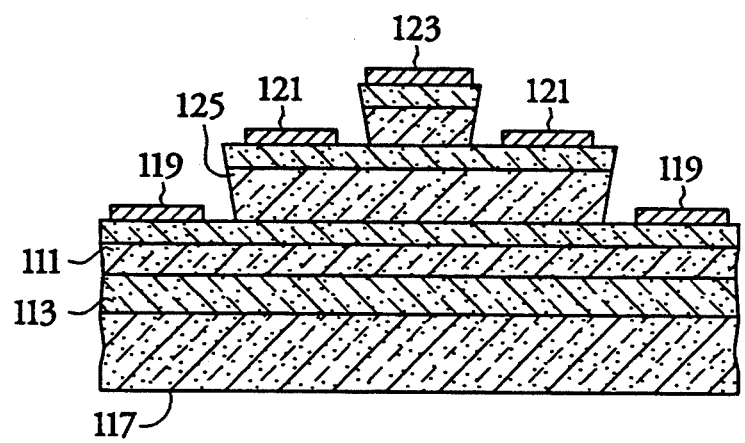
FIG. 14 is a sectional view of the same device shown in FIG. 13 after a further stage of processing to form the mesa, the active device, and backside thinning of the wafer.

After the usual fabrication steps including maskings, etchings, ion implantations as well as depositions of contact metals onto corresponding layers, a HBT is formed on the frontside of the wafer. As shown in cross-sectional view in FIG. 14, 119 is the collector contact metal, 121 is the base contact metal, 123 is the emitter contact metal, and areas 125 are proton ion implanted regions for the purpose of reducing base-collector parasitic capacitance. Procedures and methods for fabricating HBT is well known. For example, see the articles by P.M. Asbeck et al in Tech. Dig. IEDM (1984) page 864 and IEEE Trans. Micr. Th. Tech. MTT 35 (1987) page 1462. Up to this stage, the fabrication of HBT of this invention is similar to that of the prior art. However, the difference in wafer structure between this invention and the prior art at this stage is that the prior art does not contain the combination of the two extra layers identified as the 0.2-10 $\mu$m thick undoped GaAs buffer layer 111, and the 0.1-10 $\mu$m thick AlGaAs etch stop layer 113. In cases where the processing time needs to be shortened, the thickness of the buffer layer 111 may be reduced to 2.0-3.0 $\mu$m and the thickness of the etch stop layer 113 may be reduced to 0.2-1.0 $\mu$m.

The next stage of fabrication is that the wafer may then be optionally thinned down from the backside 117, using the similar process described above for FETs or as that for thinning a prior art HBT. The total thickness of the wafer, after thinning, is typically about 100 $\mu$m.

Figure 15:
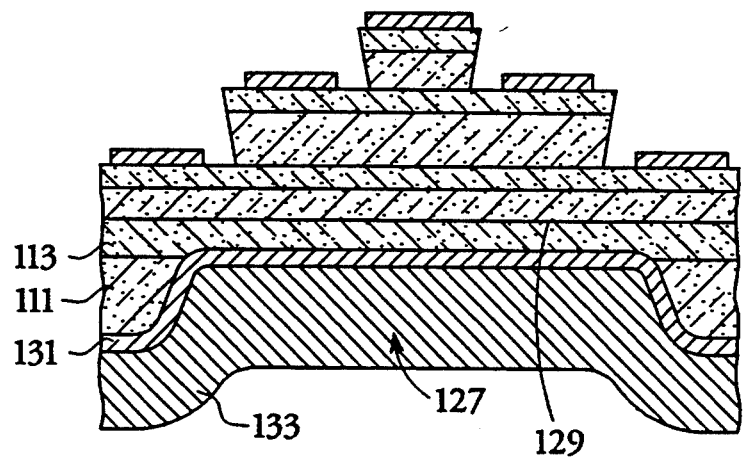
FIG. 15 is a sectional view of the same device shown in FIG. 14 after a further stage of processing to form the etched well, and plating of the gold heat conductor to the device.

The final stage of fabrication of this embodiment, which is not found in the prior art for fabricating HBT, is to mask the backside 117 of the wafer, etch heat conductor wells 127 until the bottom 129 of the wells 127 reaches the etch stop layer 113, evaporate the base metal 131 and plate the heat conductor metals 133 into the wells 127. The whole process for the well etching as well as plating into the wells 127 is almost identical as that described earlier in this specification for the FET devices. The cross-section of the completed HBT device is shown in FIG. 15. These heat conductor wells 127 can best be located underneath the HBT active regions. The active regions are defined generally as the areas under the emitter fingers, where the current density is the highest. However, for the ease of construction, the wells can be made larger than the active regions, as shown in FIG. 15. The uniformity in the etching of the wells 127 is again controlled by the etch stop layer 113 of AlGaAs. The buffer layer 111 is used to reduce possible parasitic capacitance and to prevent shorting between the heat conductor metal 133 and the collector contact layer 119 resulting from possible accidental etch through the etch stop layer 113 during fabrication.

Figure 16:
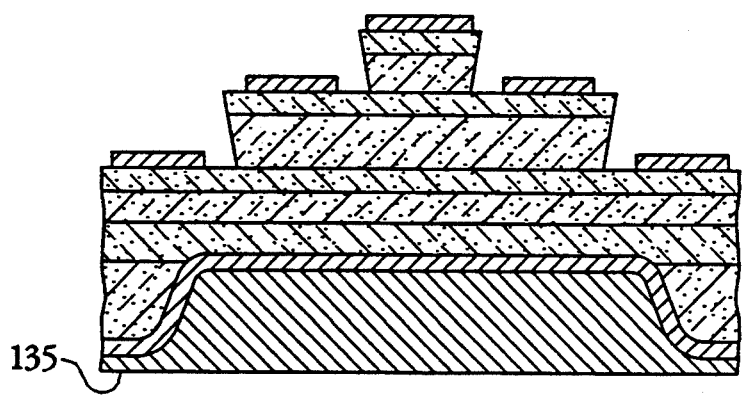
FIG. 16 is a sectional view of the third embodiment of this invention in the form of a completed GaAs/AlGaAs HBT device with the heat conductor, which is also the same device shown in FIG. 15 after a further stage of processing to smoothen the bottom surface of the heat conductor metal in order to facilitate its subsequent mounting to a carrier.

The bottom surface of the heat conductor metal layer 133 in FIG. 15, may be mechanical or electrochemical lapped or polished into a smooth ground plane 135, as shown in FIG. 16, before the chip containing the device or the IC is soldered or epoxied to a heat sink carrier. The smooth ground plane 135 would provide good thermal contact with a subsequent heat sink carrier.

The two step heat conductor structure resulted from the two step well etching process, which is described earlier in this specification as the second embodiment, may also be similarly applied to HBT devices. However, the added benefit of the two step heat conductor structure is very minimal in the case of HBT devices, especially in the case of the emitter-down HBT configuration.

The above described FET and HBT structures, as the preferred embodiments of this invention, can be applied to both FET and HBT on ICs and discrete FET and HBT devices.

It should be pointed out here that in some III-V type of compound semiconductor devices, such as a typical GaAs/AlGaAs HBT device, the active device is not very much affected by the traps and centers of the etch stop layer. In these cases, the undoped GaAs buffer layer 29, 69 or 111 may not be needed. This alternative configuration would then comprise a fourth embodiment of this invention in the form of a high power GaAs/AlGaAs heterojunction bipolar transistor (HBT). In such a configuration, formation of the buffer layer 29, 69 or 111 is omitted from the fabrication process. The heat conduction pathlength in this case is equal to the thickness of the epitaxial AlGaAs etch stop layer 27, 69 or 113, which can be in the range of 0.1 to 10 $\mu$m. More optimum range would be 0.2 to 1.0 $\mu$m.

The x value for the $Al_xGa_{1-x}As$ etch stop layer would also be less critical.

It should be noted here that the devices of this invention, examples of which are described in the above four embodiments, are formed on the front surface of the substrate and are physically separated by the etch stop layers, 27, 67 or 113 from the high thermal conductivity material deposited in the wells in the back side of the substrate. Therefore, the devices of this invention do not suffer from the limitations of the Blocker type of devices.

The above description refers to the preferred embodiments, for the purpose of illustrating this invention, in the forms of a simple n-type high power planar GaAs FET device with interdigital structure and a high power heterojunction bipolar transistor and methods for making these devices. However, these same improved heat dissipation structures can also be applied to many other high power planar GaAs FET structures, such as MODFET (or HEMT) and MISFET, semiconductor or metal resistors on GaAs ICs, and compound semiconductor lasers.

Further, although GaAs has been thus far referred to as the basic wafer material for the high power FET and HBT devices described as preferred embodiments, the basic heat dissipation concept of this invention is applicable to high power devices made of III-V compound semiconductor materials other than GaAs. III-V compound semiconductor materials are those formed in a monocrystalline lattice or polycrystalline lattices where substantially half of the lattice sites are occupied by one or more of the group III elements (boron, aluminum, gallium, indium and thallium) and substantially half of the lattice sites are occupied by one or more group V elements (nitrogen, phosphorus, arsenic, antimony and bismuth). Gallium phosphide (GAP), indium phosphide (InP) and indium antimonide (InSb) are examples of such III-V compound semiconductor materials suitable for making high frequency and high power devices and circuits. AlInAs can be a useful etch stop layer for InP. Other compound semiconductors could also be used with this structure.

I claim:

1. A III-V compound semiconductor device comprising,
    a semi-insulating III-V compound semiconductor substrate,
    a compound semiconductor etch stop layer on a front surface of said substrate, said etch stop layer characterized by an etch rate that is substantially slower than an etch rate of said substrate,
    an undoped compound semiconductor buffer layer on said etch stop layer,
    plural layers of compound semiconductor material formed on said buffer layer, said plural layers forming at least one active semiconductor device, said active semiconductor device having heat generating regions associated therewith, said substrate having wells formed in a back surface thereof, said wells being located in said substrate proximate to said heat generating regions in said plural layers, said wells in said substrate characterized by at least two different depths such that deepest portions of said wells having a distance of 0.2 to less than 5 microns from the nearest parts of said heat generating regions, and
    a thermally conductive material disposed in said wells.

2. The device of claim 1 wherein said substrate is composed of gallium arsenide.

3. The device of claim 1 wherein said etch stop layer is composed of aluminum gallium arsenide.

4. The device of claim 3 wherein said etch stop layer is composed of $Al_xGa_{1-x}As$, where $x<0.3$.

5. The device of claim 1 wherein said buffer layer is composed of undoped gallium arsenide.

6. The device of claim 1 wherein said etch stop layer has a thickness in a range of 0.1-10 $\mu m$.

7. The device of claim 6 wherein said thickness is in a range of 0.2-1.0 $\mu m$.

8. The device of claim 1 wherein said buffer layer has a thickness in a range of 0.2-10 $\mu m$.

9. The device of claim 8 wherein said thickness is in a range of 2-3 $\mu m$.

10. The device of claim 1 wherein said active semiconductor device formed in said plural layers is a field effect transistor.

11. The device of claim 1 wherein said active semiconductor device formed in said plural layers is a heterojunction bipolar transistor.

12. The device of claim 1 wherein said plural layers of compound semiconductor material form an integrated circuit.

13. A III-V compound semiconductor device comprising,
    a semi-insulating III-V compound semiconductor substrate,
    a compound semiconductor etch stop layer on a front surface of said substrate, said etch stop layer characterized by an etch rate that is substantially slower than an etch rate of said substrate,
    an undoped compound semiconductor buffer layer on said etch stop layer,
    plural layers of compound semiconductor material formed on said buffer layer, said plural layers forming at least one active semiconductor device, said active semiconductor device having heat generating regions associated therewith, said substrate having wells formed in a back surface thereof, said wells being located in said substrate proximate to said heat generating regions in said plural layers, said wells in said substrate characterized by at least two different depths such that deepest portions of said wells have a distance of 0.2 to less than 5 microns from the nearest parts of the heat generating regions, and
    wherein said wells formed in said substrate have depths under drain electrodes of said at least one active semiconductor device which are less than depths of said wells under source electrodes and drain-to-source channels of said at least one active semiconductor device, such that a heat conduction pathlength from said drain electrodes to said heat conducting material is larger than a heat conduction pathlength from said source electrodes and said drain-to-source channels to said heat conducting material.

14. The device of claim 13 wherein said heat conduction pathlength for said drain electrodes is about 10–40 $\mu m$ larger than said heat conduction pathlength for said source electrodes and said drain-to-source channels.

* * * * *